United States Patent
Kim et al.

(10) Patent No.: US 8,180,313 B2
(45) Date of Patent: May 15, 2012

(54) MIXER AND TRANSCEIVER HAVING THE MIXER

(75) Inventors: Bong-Su Kim, Daejeon (KR); Woo Jin Byun, Daejeon (KR); Kwang Seon Kim, Daejeon (KR); Min Soo Kang, Daejeon (KR); Tae Jin Chung, Daejeon (KR); Myung Sun Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 950 days.

(21) Appl. No.: 12/189,066

(22) Filed: Aug. 8, 2008

(65) Prior Publication Data

US 2009/0039943 A1    Feb. 12, 2009

(30) Foreign Application Priority Data

Aug. 10, 2007 (KR) .................. 10-2007-0080842

(51) Int. Cl.
*H04B 1/26* (2006.01)
*H04B 1/18* (2006.01)

(52) U.S. Cl. .................. 455/326; 455/313; 455/293

(58) Field of Classification Search .................. 455/326, 455/293, 311, 313, 316, 323, 118, 318
See application file for complete search history.

(56) References Cited

U.S. PATENT DOCUMENTS

| | | | |
|---|---|---|---|
| 5,563,545 A * | 10/1996 | Scheinberg | 327/389 |
| 5,787,126 A * | 7/1998 | Itoh et al. | 375/340 |
| 6,438,365 B1 * | 8/2002 | Balteanu | 455/326 |
| 6,545,516 B2 * | 4/2003 | Ylamurto et al. | 327/113 |
| 6,763,227 B2 * | 7/2004 | Kramer | 455/115.1 |
| 6,798,268 B2 | 9/2004 | Kim et al. | |
| 7,596,362 B2 * | 9/2009 | Shu | 455/313 |
| 2002/0163375 A1 | 11/2002 | Wu et al. | |
| 2005/0124311 A1 | 6/2005 | Mahmoudi et al. | |
| 2006/0132259 A1 | 6/2006 | Bae | |

FOREIGN PATENT DOCUMENTS

KR    2001-0069649    7/2001

OTHER PUBLICATIONS

Bao et al., "A 9-31-GHz Subharmonic Passive Mixer in 90-nm CMOS Technology", IEEE Journal of Solid-State Circuits, vol. 41, No. 10, Oct. 2006, pp. 2257-2264.

* cited by examiner

*Primary Examiner* — Sonny Trinh
(74) *Attorney, Agent, or Firm* — Rabin & Berdo, P.C.

(57) ABSTRACT

Provided are a mixer and a transceiver having the mixer. The mixer includes: an local oscillation (LO) differential signal generator converting an input LO signal into a differential signal; and a mixing unit receiving the LO differential signal as a first input and a first signal having a first frequency as a second input and performing differential amplification on the LO differential signal and the first signal to output a second signal having a second frequency.

13 Claims, 3 Drawing Sheets ant>

MIXER AND TRANSCEIVER HAVING THE MIXER

CROSS-REFERENCE TO RELATED PATENT APPLICATION

This application claims the benefit of Korean Patent Application No. 10-2007-0080842, filed on Aug. 10, 2007, in the Korean Intellectual Property Office, the disclosure of which is incorporated herein in its entirety by reference.

BACKGROUND OF THE INVENTION

1. Field of the Invention

The present invention relates to a mixer, and more particularly, to a mixer for converting a single signal into a differential signal in microwave and millimeter-wave transceiver structures, a transmitter and receiver having the mixer.

This work was partly supported by the IT R&D program of MIC/IITA [2005-S-046-03, Development of the basic spectrum resource utilizing technology].

2. Description of the Related Art

In the knowledge and information age, a wireless communications system has reached a stage in which a transmission rate of gigabits is required, and this results in the development of applications such as a wireless personal area network (WPAN) using millimeter-wave bands instead of existing frequency bands that have reached a saturated state. However, since a communications system using the millimeter-wave bands is constructed with individual devices, the communications system is large and expensive, and this causes a difficulty of generally utilizing the bands. In order to overcome the difficulty, millimeter-wave transceivers having a single chip type manufactured by using silicon (Si), germanium (Ge), or Si complementary metal-oxide-semiconductor (CMOS) technologies have been developed.

As a structure of the conventional transceiver, various structures such as a superheterodyne structure and a direct conversion structure have been proposed. In the structures, local oscillator (LO) frequencies input to mixers of a transmitter and a receiver are the same. It means that a fact that the transmitter and the receiver have different characteristics for LO and LO/2 frequencies is not utilized.

In addition, in order to output an intermediate frequency (IF) differential signal, the LO of the mixer has to be a differential signal, and a radio frequency (RF) signal is input to a source of a transistor, so that large conversion losses occur.

SUMMARY OF THE INVENTION

The present invention provides a mixer for improving local oscillator (LO) removal characteristics at a transmitter and reducing high-frequency components at a receiver by using an LO frequency at one side and an LO/2 frequency at the other side when the LO frequency applied to the transmitter and receiver, and a transmitter and a receiver having the mixer.

According to an aspect of the present invention, there is provided a mixer including: an LO (local oscillation) differential signal generator converting an input LO signal into a differential signal; and a mixing unit receiving the LO differential signal as a first input and a first signal having a first frequency as a second input and performing differential amplification on the LO differential signal and the first signal to output a second signal having a second frequency.

According to another aspect of the present invention, there is provided a transmitter including: a local oscillator generating an LO signal; and a mixer mixing the LO signal with an input differential IF signal to convert the input differential IF signal into a single RF signal, wherein the mixer includes: an LO differential signal generator converting the LO signal into an LO differential signal; and a mixing unit performing differential amplification on the LO differential signal and the input differential IF signal to output as the single RF signal.

According to another aspect of the present invention, there is provided a receiver including: a local oscillator generating an LO signal or an LO/2 signal; and a mixer mixing a received signal RF signal with the LO signal or the LO/2 signal to convert the single RF signal into an IF differential signal, wherein the mixer includes: an LO differential signal generator converting the LO signal or the LO/2 signal into an LO differential signal or an LO/2 differential signal; and a mixing unit performing differential amplification on the LO differential signal and the single RF signal, or the LO/2 differential signal and the single RF signal to output as the IF differential signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings.

In general, one of the most important factors of a transmitter is an intensity of a local oscillator (LO) signal flowing to a mixer disposed at an input or an output terminal of a radio frequency (RF) amplifier of the transmitter and an LO removal value associated with the intensity of the LO signal to be removed. This represents an important performance of the mixer. A certain amount of the LO signal can be removed by using a filter or an open line disposed at an RF output terminal. However, when the LO signal and the RF signal are close to each other, the removal is not easy. Therefore, a structure having high LO-RF signal isolation is needed for the mixer. And it is necessary to design a transmitter using a mixer having a sub-harmonic structure in which a low level LO signal is generated at the RF terminal.

When a receiver uses the sub-harmonic structure as the transmitter, there is an advantage in that a direct-current (DC) offset may be reduced in a direct conversion scheme. However, in a heterodyne scheme, a high harmonic is generated near an intermediate frequency (IF) signal, so that a high-order filter has to be employed. However, when the high-order filter is employed, a reception performance is degraded, so that a basic mixer using an LO frequency is needed for the receiver.

In a conventional signal transceiver, an IF signal and an LO signal are differential signals, and an RF signal is a single signal. In this case, a mixer generally used for the transmitter and receiver has a double-balanced structure in which the IF, RF, and LO signals are differential signals. The transmitter has to use a balun coupler for converting the RF differential signal into an RF single signal, and the receiver has to uses a balun distributor for converting the RF single signal into the RF differential signal.

However, significant errors exist between a design and a layout of a complex structure such as the double-balanced structure in millimeter bands, so that the complex structure is not used frequently. In addition, the balun on a signal transmission path between transmission and reception terminals increases total gain and noise figure and may cause a performance degradation of a system. Therefore, it is necessary to prepare a mixer having a simple structure for reducing performance errors and a structure without the balun on the transmission and reception paths.

Figure 1:
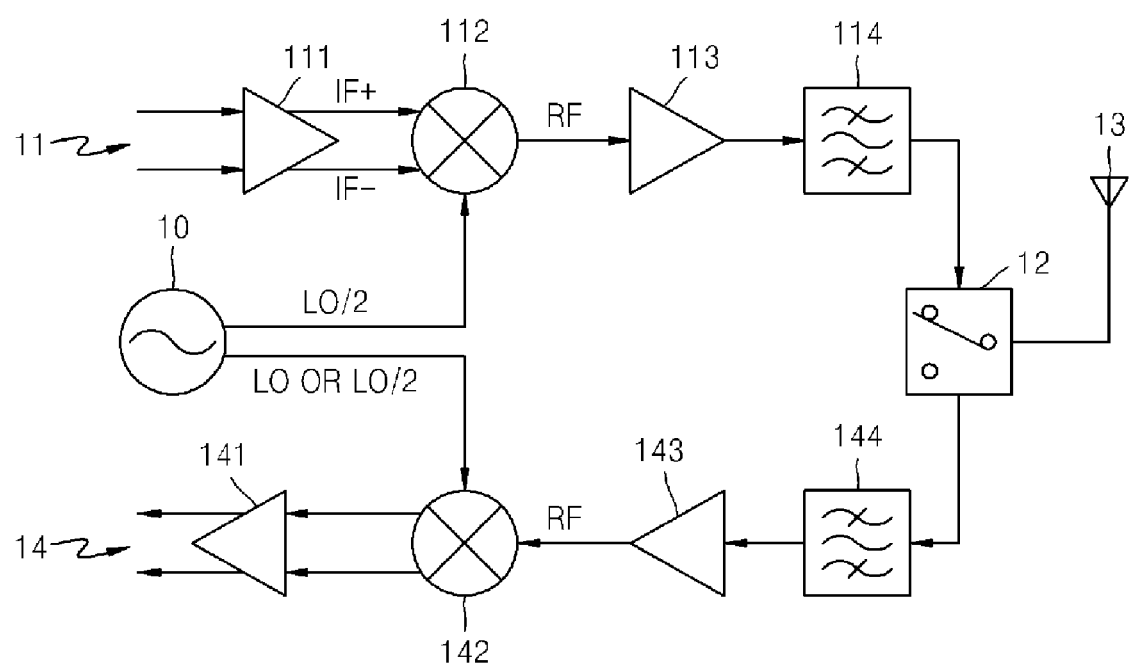
FIG. 1 illustrates a schematic configuration of a communications system according to an embodiment of the present invention.

FIG. 1 illustrates a schematic configuration of a communications system according to an embodiment of the present invention. The communications system includes an LO 10, a transmitter 11, a switch 12, an antenna 13, and a receiver 14.

The transmitter 11 includes a first amplifier 111, a first mixer 112, a second amplifier 113, and a first filter 114. The receiver 114 includes a third amplifier 141, a second mixer 142, a fourth amplifier 143, and a second filter 144.

The LO 10 is a voltage controlled oscillator (VCO) having a push-push structure and can generate LO and LO/2 frequencies. Since an LO differential signal is generally applied to a transceiver, a VCO having a structure such as a cross-coupled structure is adopted for easily outputting a differential signal. However, existing technologies can hardly support to apply a phase locked loop to a high-frequency VCO in the millimeter-wave bands. Therefore, the VOC having the push-push structure to which the PLL can be applied at the LO/2 is employed. The VCO having the push-push structure can easily output the LO/2 frequency in addition to the LO frequency.

The first amplifier 111 of the transmitter 11 amplifies an input differential IF signal. The first mixer 112 mixes the differential IF signal with the LO/2 frequency of the LO 10, up-converts the mixed signal to an RF single signal and outputs the RF signal. The second amplifier 113 amplifiers the RF signal, and the first filter 114 performs filtering on the amplified RF signal. The filtered RF signal is transmitted through the switch 12 and the antenna 13.

The second filter 144 of the receiver 14 performs filtering on the signal received through the antenna 13 and the switch 12 to output as an RF signal, and the fourth amplifier 143 amplifies the filtered RF signal. The second mixer 142 mixes the RF signal with an LO or LO/2 signal and down-converts the mixed signal to an IF differential signal, and the third amplifier 141 amplifies to output the IF signal.

Figure 2:
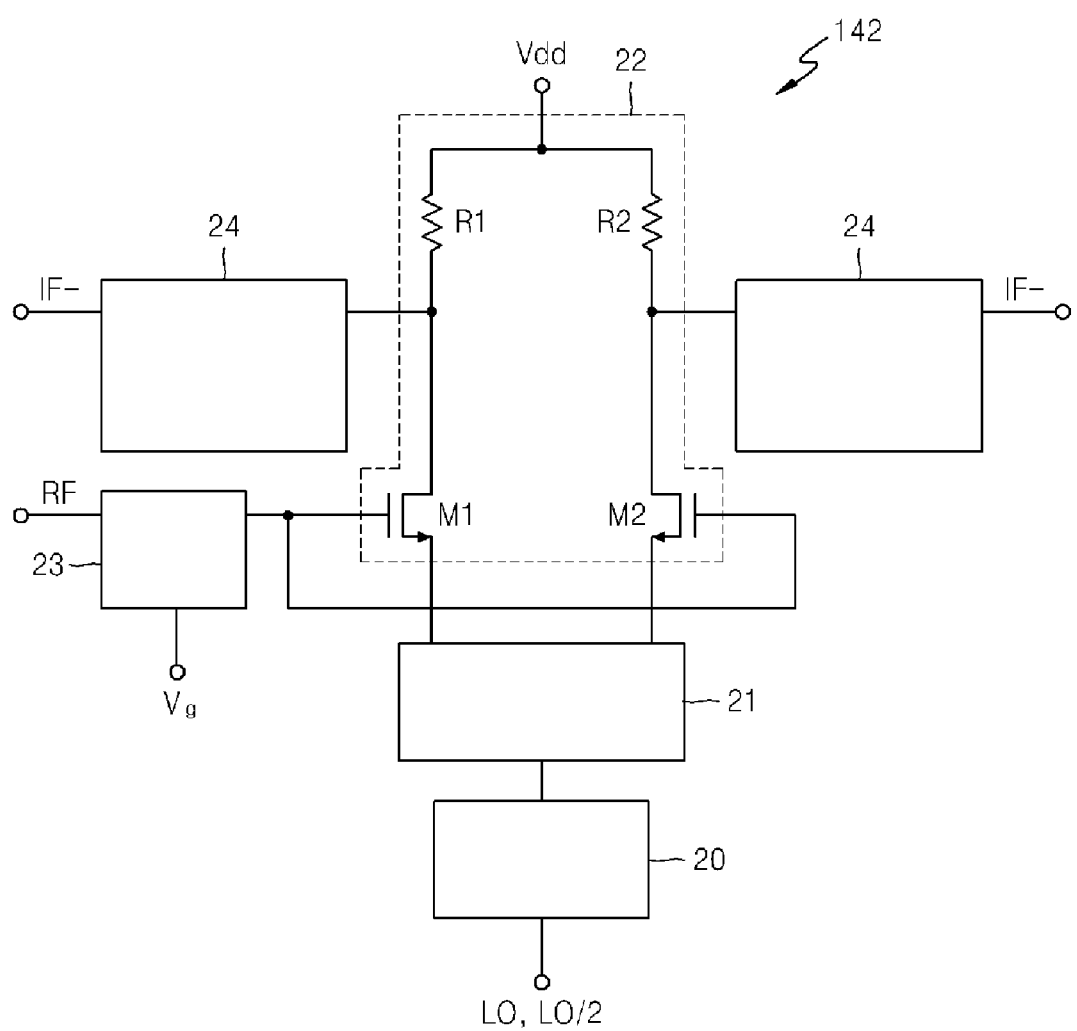
FIG. 2 is a circuit diagram illustrating a mixer according to an embodiment of the present invention.

FIG. 2 is a circuit diagram illustrating the mixer 142 according to the present invention.

Although the illustrated mixer is the second mixer 142 employed in the receiver 14, it may be employed as the first mixer 112 of the transmitter 11 when signals input and output through each terminal are changed.

Referring to FIG. 2, the mixer 142 includes a high-pass filter 20, an LO differential signal generator 21, a mixing unit 22, an input matching unit 23, and an LO removal filter 24.

The high-pass filter 20 is used to prevent the IF signal from being fed back and input through transistors M1 and M2 of the mixing unit 22 in addition to the LO or LO/2 signal from being fed back through an LO input terminal. The LO differential signal generator 21 includes a balun which has a phase difference of 180° when the LO signal is input through the LO terminal. As a simple balun, a distributor having a transmittion length difference of a half wavelength at an LO frequency may be used.

When the LO/2 is input through the LO terminal, a balun having a phase difference of 90°, for example, a distributor having a line length difference of a wavelength/4 may be used to generate a differential signal.

The LO and LO/2 signals input through the LO terminal are input to sources of the transistors M1 and M2 of the mixing unit 22, respectively, and operated with an RF signal input through gates to generate various IF signals as follows.

$$f_{IF} = |f_{RF} \pm n f_{LO}|, \text{where, } n=1,2, \qquad \text{[Equation 1]}$$

Here, n=1 for a first-order mixer and n>1 for a sub-harmonic mixer. A bias condition of the transistor may be changed according to a type of the input LO signal.

When the RF signal is input through an RF terminal, the input matching unit 23 performs matching of an input port with the transistor. Since the RF signal is input through the gate, less conversion losses occur as compared with a general structure in which the RF signal is input through the source. This is because resistance $g_m$ between the gate and a drain is much smaller than resistance $g_{ds}$ between the source and the drain.

The low-pass filter 24 may further be included at the IF output terminal in order to remove an unnecessary LO signal. A simple short line or an open line may be used to further remove the LO signal.

When the illustrated mixer is used for the transmitter 11, the LO/2 signal is input to the LO terminal, and the LO differential signal generator 21 generates an LO/2 differential signal by employing the balun having the phase difference of 90°.

The differential IF signal is input to the gates of the transistors M1 and M2, which are the RF terminals, and RF signals having the same phase are output to the IF terminals. A single RF signal can be obtained by coupling the output RF signals by using a coupler. It is important for the transmitter 11 to reduce the amplitude of the output LO signal. For this, the LO/2 frequency may be used.

Figure 3A:
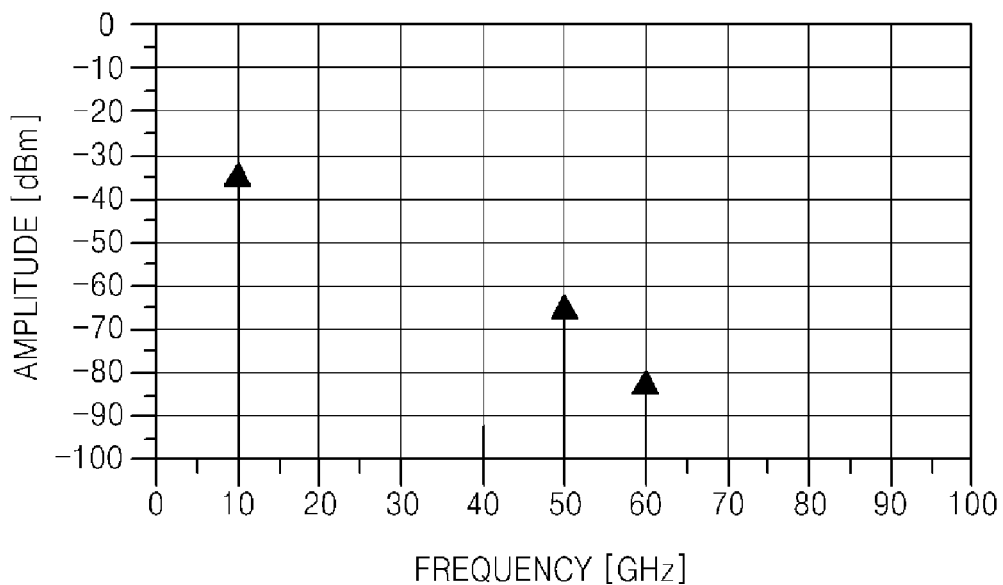
FIG. 3A illustrates a simulation result of high-frequency characteristics of signals output from an intermediate frequency (IF) output terminal when a radio frequency (RF) of 60 GHz, an LO frequency of 50 GHz, and an IF frequency 10 GHz are used.
Figure 3B:
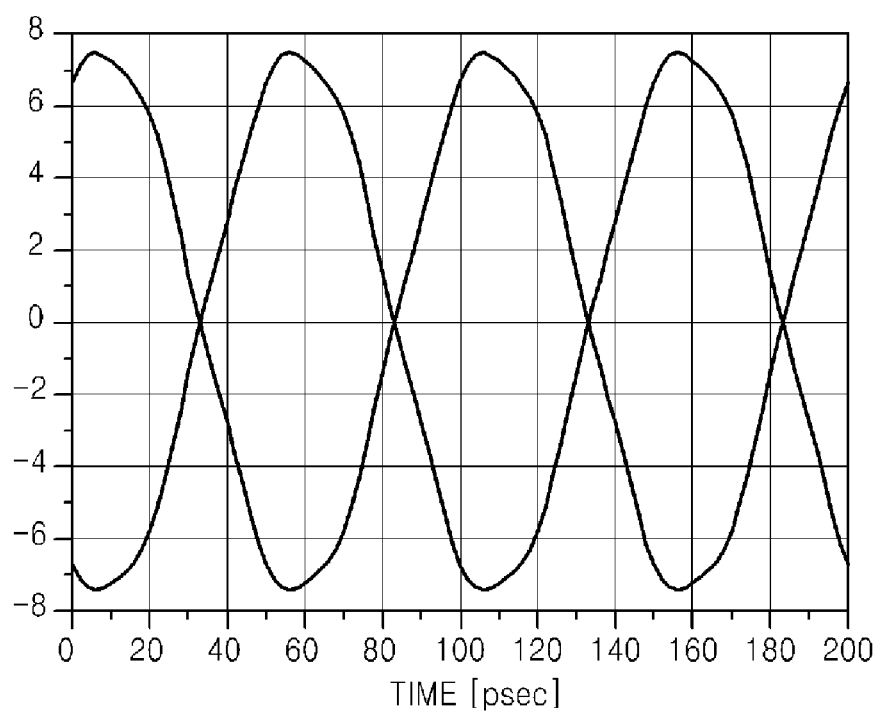
FIG. 3B illustrates an IF differential signal output from an IF terminal illustrated in FIG. 2.

FIG. 3A illustrates a result of a simulation of high-frequency characteristics of signals output through the IF output terminal when an RF of 60 GHz, an LO frequency of 50 GHz, and an IF of 10 GHz are used. FIG. 3B illustrates an IF differential signal output through the IF terminal.

When a RF input power is −30 dBm and an LO input power is +2 dBm, it can be seen that an IF output power output through the IF output terminal is −33 dBm. Since the RF and LO frequency are not completely removed at the IF terminal, the low-pass filter 24 can be used to pass only the IF frequency.

Referring to FIG. 3B, the IF differential signal shows the phase difference of 180°.

According to the present invention, different LO frequencies are used for the transmitter and the receiver, so that LO frequency removal characteristics of the transmitter can be improved, and a performance degradation of the receiver due to the high-frequency components can be minimized. Therefore, a performance of the entire communications system can be increased.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A mixer comprising:
a LO (local oscillation) differential signal generator converting an input LO signal into a LO differential signal;
a mixing unit receiving the LO differential signal as a first input and a first signal having a first frequency as a second input and performing differential amplification on the LO differential signal and the first signal so as to output a second signal based upon the differential amplification and having a second frequency, and the mixing unit includes a plurality of transistors, each of which includes a source terminal receiving the LO differential signal output from the LO differential signal generator, a gate terminal receiving the first signal and a drain terminal, the transistors for differentially amplifying the first signal to output the second signal to the drain terminals.

2. The mixer of claim 1, wherein the input LO signal has a LO frequency or a LO/2 frequency.

3. The mixer of claim 2, wherein, the input LO signal has the LO frequency and the LO differential signal generator is a balun having two output ports and a phase difference of 180 between signals on the two output ports.

4. The mixer of claim 2, wherein, the input LO signal has the LO frequency and the LO differential signal generator is a distributor having two output ports connected with two lines that have a line length difference therebtween of a half wavelength of the input LO signal.

5. The mixer of claim 2, wherein the input LO signal has the LO/2 frequency and the LO differential signal generator is a balun having two output ports with a phase difference of 90 between signals on the two output ports.

6. The mixer of claim 2, wherein the input LO signal has the LO/2 frequency, the LO differential signal generator is a distributor having two output ports connected with two lines that have a line length difference therebetween of a wavelength/4 of the input LO signal.

7. The mixer of claim 1, wherein, the first signal includes two RF (radio frequency) signals having the same phase and the second signal is an IF (intermediate frequency) differential signal.

8. The mixer of claim 1, further comprising a high-pass filter which is disposed between a terminal through which the input LO signal is input and the LO differential signal generator to block a signal fed back from the mixing unit and pass only the input LO signal.

9. The mixer of claim 1, wherein the mixing unit further includes a LO removal filter preventing the input LO signal from being added to the second signal and an output.

10. The mixer of claim 1, wherein the first signal is a differential IF (intermediate frequency) signal and the second signal includes two combined RF signals having the same phase.

11. A transmitter comprising:
a local oscillator generating a LO signal; and
a mixer mixing the LO signal with an input differential IF signal to convert the input differential IF signal into a single RF signal, the mixer including
a LO differential signal generator converting the LO signal into a LO differential signal, and
a mixing unit performing differential amplification on the LO differential signal and the input differential IF signal so as to output the single RF signal.

12. A receiver comprising:
a local oscillator generating a LO signal or a LO/2 signal; and
a mixer mixing a received, single RF signal with the LO signal or the LO/2 signal to convert the single RF signal into an IF differential signal, the mixer including
a LO differential signal generator converting the LO signal or the LO/2 signal into a LO differential signal or a LO/2 differential signal, and
a mixing unit performing differential amplification on the LO differential signal and the single RF signal, or the LO/2 differential signal and the single RF signal so as to output the IF differential signal.

13. The receiver of claim 12, wherein the local oscillator is a voltage controlled oscillator having a push-push structure for generating the LO signal or the LO/2 signal.

* * * * *